United States Patent
Vogel et al.

(10) Patent No.: US 11,041,254 B2
(45) Date of Patent: Jun. 22, 2021

(54) CHAMFERED SILICON CARBIDE SUBSTRATE AND METHOD OF CHAMFERING

(71) Applicant: SiCrystal GmbH, Nuremberg (DE)

(72) Inventors: Michael Vogel, Nuremberg (DE); Bernhard Ecker, Nuremberg (DE); Ralf Müller, Zirndorf (DE); Arnd-Dietrich Weber, Forchheim (DE); Matthias Stockmeier, Egloffstein (DE)

(73) Assignee: SICRYSTAL GMBH, Nuremberg (DE)

( * ) Notice: Subject to any disclaimer, the term of this patent is extended or adjusted under 35 U.S.C. 154(b) by 0 days.

(21) Appl. No.: 16/409,698

(22) Filed: May 10, 2019

(65) Prior Publication Data

US 2019/0345635 A1 Nov. 14, 2019

(30) Foreign Application Priority Data

May 11, 2018 (EP) ..................................... 18171736

(51) Int. Cl.
*B24B 9/02* (2006.01)
*C30B 29/36* (2006.01)
(Continued)

(52) U.S. Cl.
CPC ................ *C30B 29/36* (2013.01); *B24B 9/02* (2013.01); *C30B 29/60* (2013.01); *C30B 33/00* (2013.01);
(Continued)

(58) Field of Classification Search
CPC ......... B24B 9/02; B24B 9/065; B24B 37/042; H01L 21/02021; C30B 29/36; C30B 29/60; C30B 33/00; C30B 33/08
(Continued)

(56) References Cited

U.S. PATENT DOCUMENTS

| 5,045,505 A | 9/1991 | Kimura |
| 5,117,590 A * | 6/1992 | Kudo ..................... B24B 9/065 |
| | | 451/239 |

(Continued)

FOREIGN PATENT DOCUMENTS

| CA | 881786 A | 9/1971 |
| CN | 101607377 A | 12/2009 |

(Continued)

OTHER PUBLICATIONS

European Patent Office Search Report for Application No. 18181736.4 dated Oct. 12, 2018, 5 pages.

(Continued)

*Primary Examiner* — Eileen P Morgan
(74) *Attorney, Agent, or Firm* — Michael Best & Friedrich LLP

(57) ABSTRACT

The present invention relates to a chamfered silicon carbide substrate which is essentially monocrystalline, and to a corresponding method of chamfering a silicon carbide substrate. The silicon carbide substrate (100) comprises a main surface (102) and a circumferential end face surface (114) which is essentially perpendicular to the main surface (102), and a chamfered peripheral region (110), wherein a first bevel surface (106) of the chamfered peripheral region (110) includes a first bevel angle (a1) with said main surface (102), and wherein a second bevel surface (108) of the chamfered peripheral region (110) includes a second bevel angle (a2) with said end face surface (114), wherein, in more than 75% of the peripheral region, said first bevel angle (a1) has a value in a range between 20° and 50°, and said second bevel angle (a2) has a value in a range between 45° and 75°.

18 Claims, 7 Drawing Sheets

(51) Int. Cl.
*C30B 29/60* (2006.01)
*C30B 33/00* (2006.01)
*H01L 21/02* (2006.01)
*B24B 9/06* (2006.01)
*B24B 37/04* (2012.01)

(52) U.S. Cl.
CPC ........ *H01L 21/02021* (2013.01); *B24B 9/065* (2013.01); *B24B 37/042* (2013.01)

(58) Field of Classification Search
USPC .................................................... 451/41, 44
See application file for complete search history.

(56) References Cited

U.S. PATENT DOCUMENTS

| | | | | |
|---|---|---|---|---|
| 5,490,811 | A * | 2/1996 | Hosokawa | B24B 9/065 451/239 |
| 5,866,477 | A | 2/1999 | Ogawa et al. | |
| 5,928,066 | A * | 7/1999 | Hasegawa | B24D 9/06 451/173 |
| 6,174,222 | B1 * | 1/2001 | Sato | B24B 9/065 451/44 |
| 6,267,649 | B1 * | 7/2001 | Lai | B24B 9/065 451/397 |
| 6,302,769 | B1 * | 10/2001 | Nishi | B24B 9/065 257/E21.237 |
| 6,361,405 | B1 * | 3/2002 | David | B24B 37/042 451/41 |
| 6,439,969 | B1 * | 8/2002 | Koma | H01L 23/544 451/41 |
| 7,655,315 | B2 * | 2/2010 | Kamiyama | H01L 21/76243 428/446 |
| 8,865,324 | B2 | 10/2014 | Straubinger et al. | |
| 8,975,643 | B2 | 3/2015 | Okita et al. | |
| 9,492,910 | B2 | 11/2016 | Ishii et al. | |
| 10,000,031 | B2 * | 6/2018 | Elliott | B29D 99/0089 |
| 2005/0142882 | A1 * | 6/2005 | Kida | H01L 21/02008 438/692 |
| 2005/0161808 | A1 * | 7/2005 | Anderson | H01L 21/76256 257/730 |
| 2007/0105258 | A1 * | 5/2007 | Yoshida | H01L 21/02021 438/46 |
| 2008/0293336 | A1 | 11/2008 | Zhang et al. | |
| 2009/0163119 | A1 * | 6/2009 | Yamazaki | B24B 9/065 451/43 |
| 2011/0300323 | A1 | 12/2011 | Straubinger et al. | |
| 2012/0156886 | A1 | 6/2012 | Shirako et al. | |
| 2012/0325196 | A1 * | 12/2012 | Okita | H01L 21/02021 125/2 |
| 2013/0101790 | A1 * | 4/2013 | Okafuji | B24B 9/065 428/141 |
| 2013/0264584 | A1 * | 10/2013 | Okita | H01L 23/562 257/77 |
| 2014/0027787 | A1 | 1/2014 | Gunjishima et al. | |
| 2014/0073228 | A1 | 3/2014 | Okita et al. | |
| 2014/0340730 | A1 * | 11/2014 | Bergh | B23K 26/402 359/275 |
| 2016/0086798 | A1 | 3/2016 | Tanaka et al. | |
| 2016/0233080 | A1 * | 8/2016 | Tanaka | C30B 25/186 |
| 2017/0256391 | A1 | 9/2017 | Okita et al. | |
| 2017/0301533 | A1 | 10/2017 | Miyazawa et al. | |
| 2018/0019115 | A1 | 1/2018 | Fan et al. | |
| 2018/0085851 | A1 * | 3/2018 | Hirata | B23K 26/40 |
| 2020/0090923 | A1 * | 3/2020 | Yamashita | H01L 21/02024 |
| 2020/0203163 | A1 * | 6/2020 | Kamei | H01L 29/34 |

FOREIGN PATENT DOCUMENTS

| | | |
|---|---|---|
| CN | 105814245 A | 7/2016 |
| DE | 102013210057 A1 | 12/2014 |
| JP | H10125633 A | 5/1998 |
| JP | 2006120865 A | 5/2006 |
| JP | 2010235390 A | 10/2010 |
| JP | 2011192687 A | 9/2011 |

OTHER PUBLICATIONS

Chinese Patent Office Action and Search Report for Application No. 201910394737.9 dated Jun. 3, 2020 (14 pages, English translation included).
Japanese Patent Office Action for Application No. 2019-089781 dated Sep. 23, 2020 (6 pages, English translation included).
Bond, "Device for preparing accurately X-ray oriented crystals." Journal of Scientific Instruments, 1961;38(2):63-64.
European Patent Office Search Report for Application No. 18171737.2, dated Oct. 9, 2018, 10 pages.
Japanese Patent Office Action for Application No. 2019-089737 dated Sep. 23, 2020 (6 pages, English translation included).
Chinese Patent Office Action and Search Report for Application No. 201910395403.3 dated Nov. 4, 2020 (17 pages, English translation included).

* cited by examiner

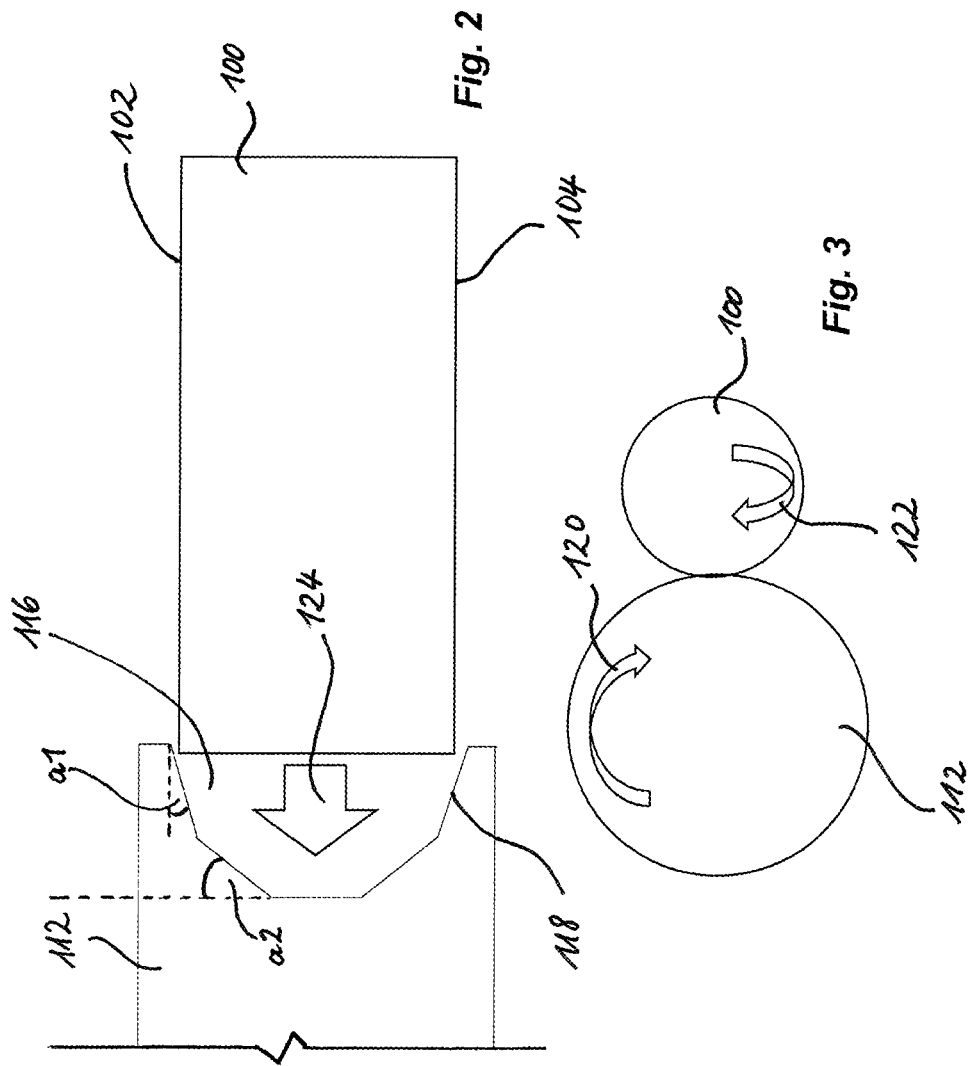

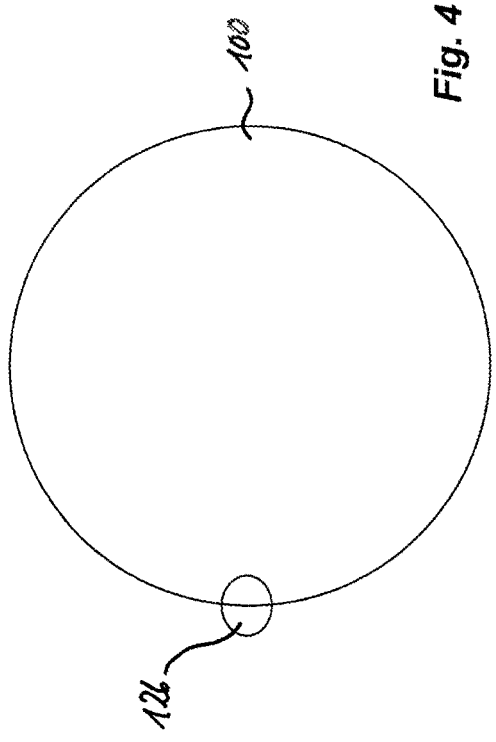
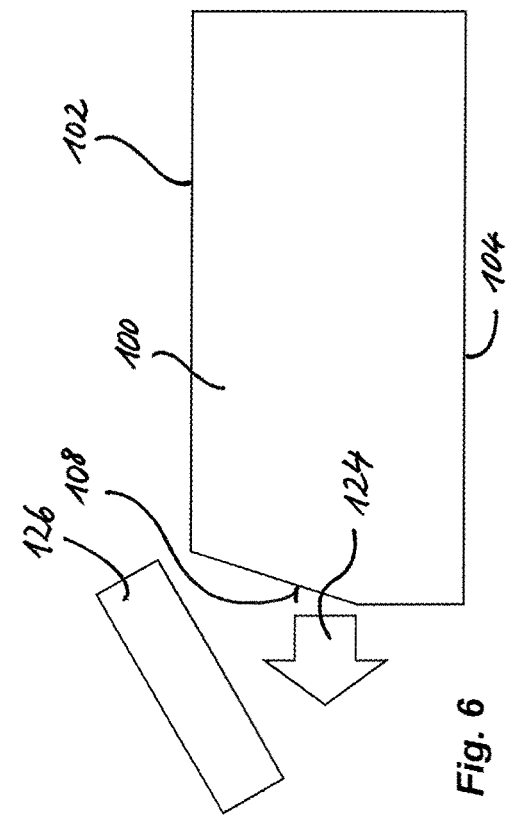
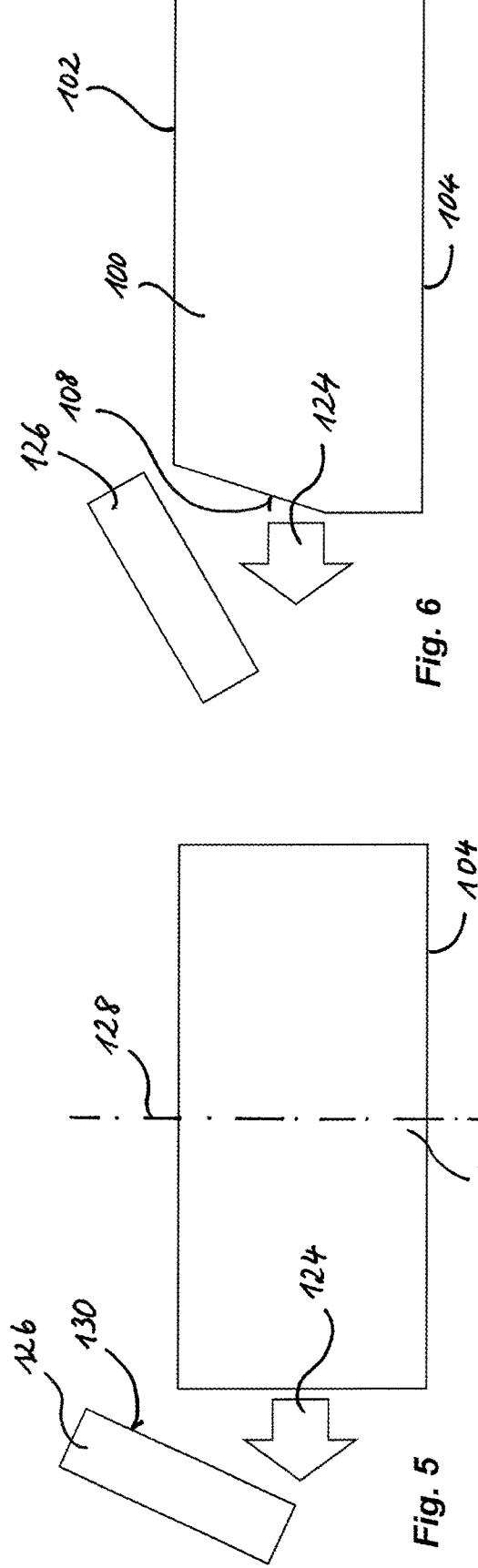

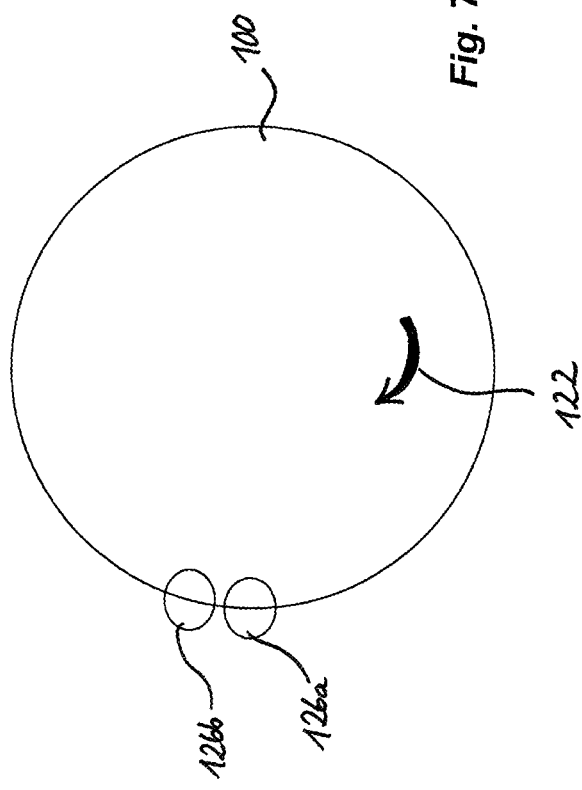
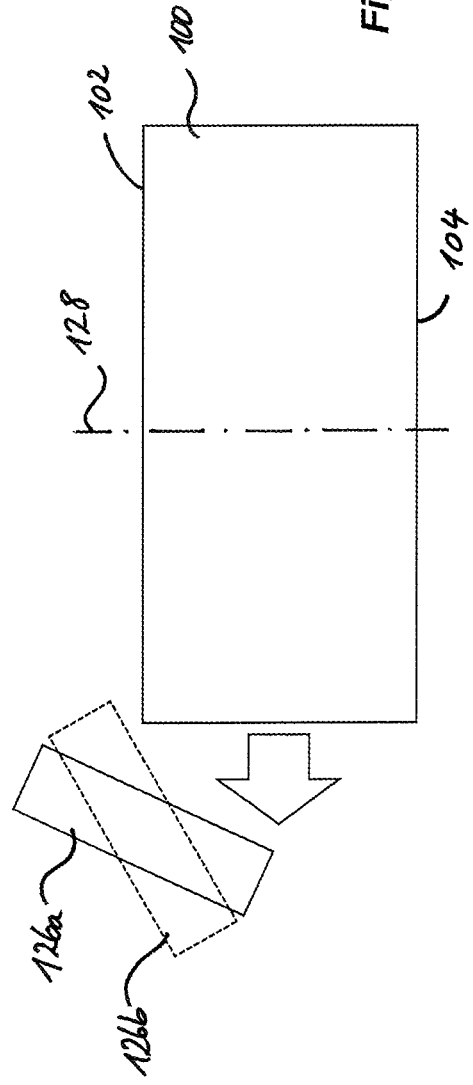

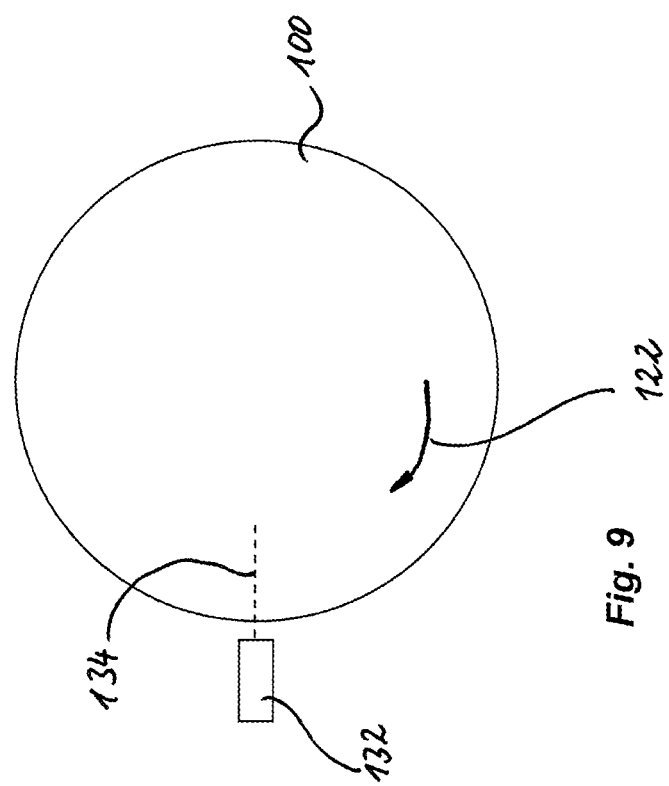

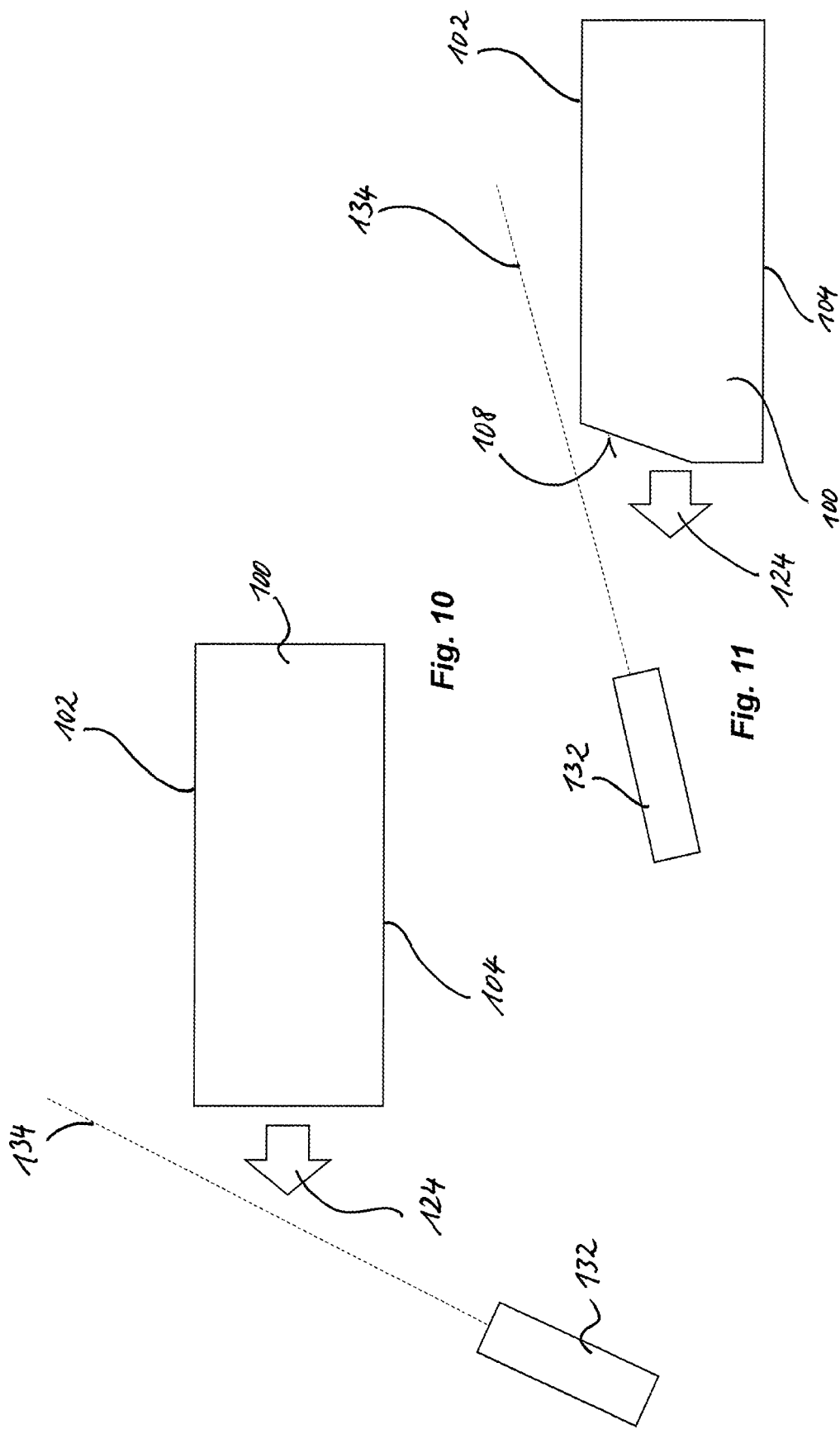

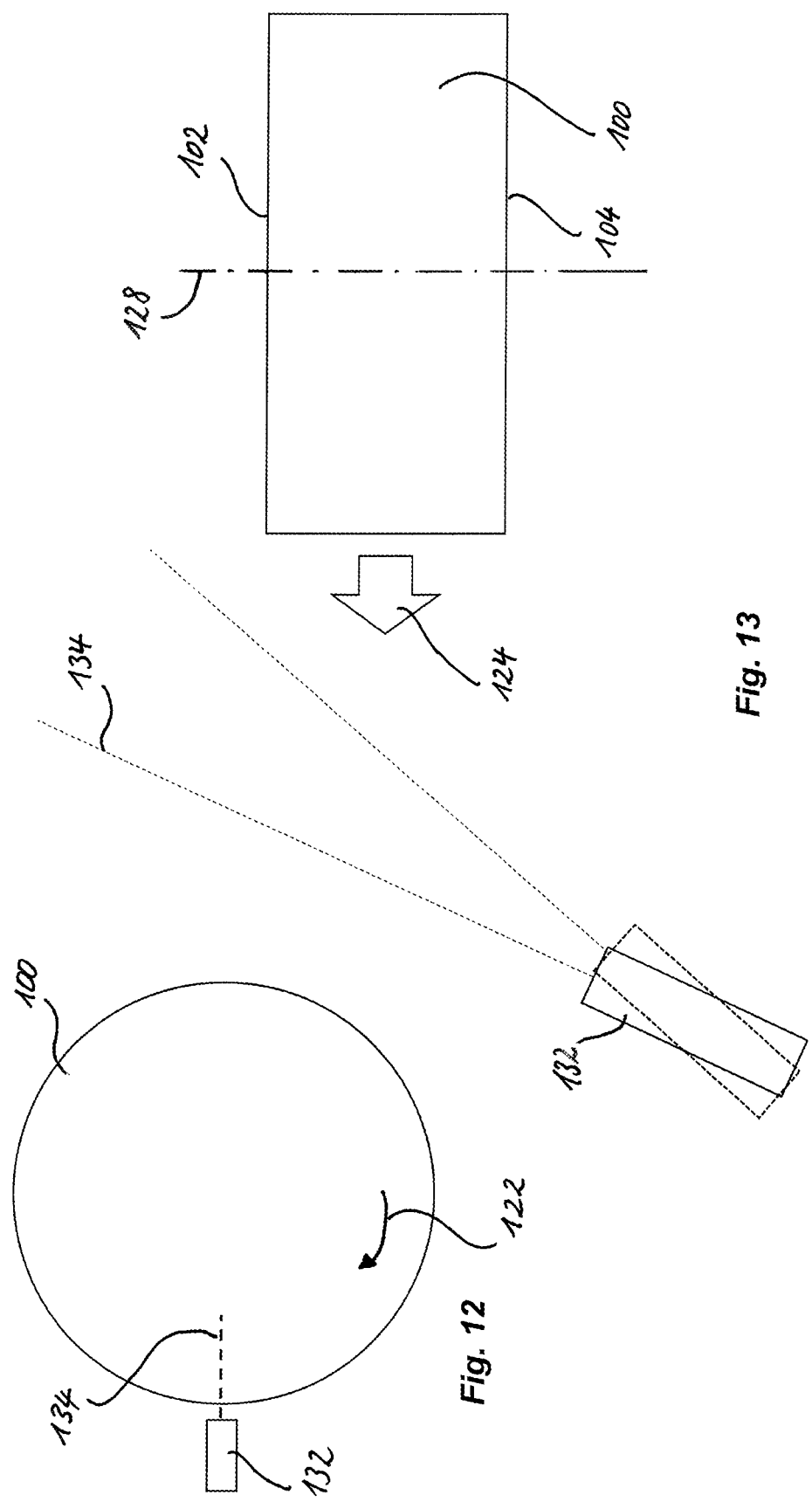

CHAMFERED SILICON CARBIDE SUBSTRATE AND METHOD OF CHAMFERING

This application claims priority to European Patent Application No. 18171736.4, filed May 11, 2018, the content of which is incorporated herein by reference in its entirety.

The present invention relates to a chamfered silicon carbide substrate which is essentially monocrystalline, and to a corresponding method of chamfering a silicon carbide substrate.

Due to its outstanding physical, chemical and electrical properties silicon carbide is used inter alia as a semiconductor substrate material for power electronics semiconductor components, for radio frequency components and for a variety of special light emitting semiconductor components. Bulk SiC crystals with ideally pure and defect-free quality are required as a basis for these products.

As this is known in the art, bulk SiC crystals are generally produced by means of physical vapor deposition techniques, in particular using a sublimation method as for instance shown in U.S. Pat. No. 8,865,324 B2. Temperatures of more than 2000° C. are required for this process. Physical vapor transport (PVT) is essentially a sublimation and re-condensation process, in which a source material and a seed crystal are placed inside a growth furnace in such a way that the temperature of the source material is higher than that of the seed, so that the source material sublimes and the vapor species diffuse and deposit onto the seed to form single crystals.

For producing wafer-shaped substrates, the bulk SiC crystals are sliced e. g. by means of diamond wire saws. The surface is refined by subsequent multistage polishing steps. In order to mechanically stabilize the substrate during these processing steps, the edge of the substrate is usually mechanically treated. For fabricating electronic components, thin monocrystalline layers (e. g. SiC or GaN) are epitaxially deposited on the polished substrates. The characteristics of these layers and consequently the quality of the electronic components fabricated therefrom decisively depend on the quality of the underlying SiC substrate, and particularly on the characteristics of the main surface. The characteristics of the main surface include for instance roughness, damage, orientation, and dislocation density. It is known to use so-called off oriented substrates in order to achieve a crystal growth involving step-flow, thereby avoiding facetted crystal growth. With step-flow growth the quality of the epitaxial layers can be improved because the offcut produces a series of steps and terraces on the SiC surface that promotes lateral growth (step-flow growth). In this manner, the epitaxial layer replicates the stacking order of the substrate, and high quality epitaxial growth ensues.

In the context of the present invention, the term "off orientation" signifies the situation where the main surface of the substrate on which the epitaxial layers are to be grown includes an angle with a defined lattice plane. In other words, the normal axis of the main surface is not oriented to coincide with the normal axis of this lattice plane, but is oriented to be "off axis". On the other hand, substrates where the normal axis of the main surface coincides with the normal axis of the basal lattice plane, are called "on axis".

While the ensuing description of the invention is directed primarily to 4H—SiC substrate materials, it will be appreciated that the utility of the invention is not thus limited, and that the invention broadly contemplates other types of silicon carbide substrates, such as exist in a great variety of hexagonal (H), rhombohedral (R) and cubic (C) crystal forms, among the more than 200 polytypes of silicon carbide. Illustrative polytypes include 4H—SiC, 6H—SiC, 15R—SiC, and 3C—SiC. 4H—SiC and 6H—SiC are presently preferred, with 4H—SiC being most preferred.

In this respect, it is to be noted that the offcut epitaxial growth surface is described herein for various hexagonal crystallographic forms of SiC, in corresponding hexagonal directional notation. For other crystalline forms of SiC, e.g., rhombohedral, cubic, etc., suitable offcut surfaces may be analogously described with respect to their planes, angles and directions, in equivalent crystallographic directional notations that are specific to such other crystalline forms.

The present invention contemplates the formation of corresponding substrates. In the case of 4H—SiC, the substrate has a planar growth surface (interface) that is offcut, i.e., inclined with respect to the axis of a basal plane thereof, with an angle of inclination between the planar growth surface and the axis of the basal plane (offcut angle) from about 0.5 to about 8°, more preferably 4°. The substrates may be (0001) SiC substrates offcut towards the <1100> or the <1120> crystalline direction.

SiC monocrystals and the substrates fabricated therefrom are highly brittle and have a low ductility. This feature needs to be taken into account when working the substrate because the form and the quality of the peripheral edge, mainly the absence of defects and the roughness, has a decisive influence on the quality of the epitaxial layers that are later deposited on the substrate.

The inventors of the present invention have recognized that the mechanical characteristics of the SiC crystal lattice are anisotropic, so that the mechanical stability of the substrate edges is reduced. During the polishing process, the substrate is subjected to a multitude of mechanical forces in particular in the region of the peripheral edges, for instance by shocks when being handled, during cementing on and detaching from carrier units, or during polishing steps within cage rotors.

For instance, indentations or angular structures may easily break off, thus forming breakouts or chipping. Thereby the polishing process and the surface quality are impaired as a consequence of undesired particles which cause scratches that reduce the surface quality. Furthermore, such breakouts and chipping may also form nuclei for cracks and cause fracture of the complete substrate during the substrate fabrication process or later during the epitaxial processes as a consequence of thermally induced tensioning.

Moreover, double-sided polishing processes within squirrel cages may lead to working the cage into the edges of the wafer. Indentations, in particular grooves and trenches, may represent sources for contaminations which can be brought into the epitaxial process.

The high brittleness of the SiC material requires during all processing steps a minimization of the locally acting forces in order to avoid chipping or breakouts. For the subsequent process steps of depositing epitaxial layers, a smooth transition from the main surface into the peripheral edge region is a feature decisive for the quality of the deposited layers. An unfavorable form of a chamfering at the edge can lead to undesired epitaxial defects, which may spread from the edge into the main surface of the substrate. Structural discontinuities in the shape of the edge and the local orientation of the surface with respect to the lattice plane of the crystal lattice may act as nuclei for undesired crystal growth modes, e.g., change of modification and/or polytype, or as foreign matter.

Conventional wafer fabrication processes often put up with breakouts or fractures which reduce the yield of the epitaxial deposition, thereby having to deal with a reduced rate of yield for the complete production chain. Fracture or chipping of the substrate may be reduced within certain limits by adapting the process parameters, such as the press-on pressure during polishing. However, this compromise has a negative impact on other parameters, for instance, by enhancing the required duration of the polishing step. Furthermore, conventionally a reduced area yield per unit is accepted in relation to the epitaxial process.

Examples for conventional wafer production processes that apply chamfered edges with one single constant bevel angle to the periphery of the wafer are disclosed in U.S. Pat. No. 5,866,477 A and US 2008/293336 A1. Furthermore, it is known to fabricate silicon substrates with a curved chamfered edge, as for instance disclosed in U.S. Pat. No. 6,302,769 B 1 and JP 2006-120865 A. These curved edges do not have a constant angle, but a continuously changing bevel angle.

Consequently, there is still a need for an improved silicon carbide substrate and a method of chamfering an essentially monocrystalline silicon carbide substrate, so that breakouts and chipping are avoided, at the same time ensuring improved characteristics of the epitaxial layers grown on the substrate and enhancing the yield of the epitaxial deposition process.

This object is solved by the subject matter of the independent claims. Advantageous embodiments of the present invention are the subject matter of the dependent claims.

The present invention is based on the idea that a double bevel with defined bevel angles provides an optimal geometry of the substrate edges, ensuring mechanical robustness and enhancing the yield of epitaxial processes performed on these substrates.

In particular, the present invention provides a silicon carbide substrate which is essentially monocrystalline, the silicon carbide substrate comprising a main surface and a circumferential end face surface which is essentially perpendicular to the main surface, and a chamfered peripheral region, wherein a first bevel surface of the chamfered peripheral region includes a first bevel angle with said main surface, and wherein a second bevel surface of the chamfered peripheral region includes a second bevel angle with said end face surface. According to the present invention, in more than 75% of the peripheral region, said first bevel angle has a value in a range between 20° and 50°, and said second bevel angle has a value in a range between 45° and 75°.

This arrangement has the advantage that the mechanical stability is enhanced, and that fractures, breakouts, and chipping of the substrate can be avoided. Moreover, the yield of epitaxial deposition steps is enhanced.

The first bevel which is adjacent to the main surface has the advantage that it provides a defined entry area for the polishing pad in a chemical-mechanical polishing (CMP) step. The so-called rotary table method is most commonly used in several CMP methods today. In this method, a pad is affixed to a table, a polishing suspension, also called slurry, is dropped onto the pad, a substrate (often also called "wafer" or "disc") is pressed against the pad with the wafer's face facing down, and the table and wafer are rotated. In these conditions, the wafer is polished. It is important that the entry region for the polishing cloth is adapted to the parameters of the polishing process, e.g., the tuft depth of the polishing cloth and/or the viscosity and composition of the polishing suspension. For providing a smooth transition between the main surface and the edge region, the bevel angle between the main surface and the bevel surface should have a well-defined, preferably small value.

On the other hand, the second bevel defines the final height of the peripheral end face of the substrate. For so-called double sided polishing (DSP) steps using a rotating disc in a rotor cage, this base height should be adjusted to the thickness of the rotor disc in order to absorb the lateral pressure onto the substrate which is exerted by the contact to the rotor cage. The second bevel stabilizes the end face against the lateral pressure and enhances the mechanical stability against chipping, breakouts and fracture of the substrate if the second bevel angle between the end face and the bevel surface is small enough.

The inventors of the present disclosure have recognized that the requirements at the border area between the main surface and the bevel surface on the one hand, and at the border area between the end face and the bevel surface on the other hand can be met optimally by providing a double bevel with two defined bevel angles. It is clear for a person skilled in the art that also more than just two bevel surfaces may be provided. A double bevel, however, is preferred.

According to an advantageous embodiment of the present invention, a sum of said first bevel angle and said second bevel angle has a value of less than 90°. The sum of 90° would mean that the bevel surfaces form one flat surface, any sum value of more than 90° would signify a concave peripheral region.

According to an advantageous embodiment of the present invention, the chamfered peripheral region is arranged around at least 85% or at least 95% of the total circumference of the substrate. This relatively high proportion has the advantage that the mechanically stabilizing effect of the chamfer is taken advantage of to a sufficiently high extent.

Furthermore, the first bevel surface of the substrate according to an example of the present invention has a surface roughness of equal to or less than 10 nm, preferably on at least 80% of the chamfered peripheral region. Such a relatively smooth surface of the chamfered region further enhances the quality of the epitaxial layers grown on the substrate. Moreover, the second bevel surface may have a surface roughness of equal to or less than 25 nm.

As already mentioned above, the principles of the present invention can be applied to all types of silicon carbide substrates, in particular to substrates that have a polytype selected from a group comprising 4H, 6H, 15R, and 3C.

Advantageously, the substrate is offcut so that the tilt angle is in a range between 0° and 8°. Preferable, the tilt angle is 4°. However, it is clear for a person skilled in the art that the present invention is not limited to these particular values, larger angles may also be used.

Advantageously, the silicon carbide substrate has a thickness of at least 200 μm and not more than 1000 μm. More specifically, the silicon carbide substrate may have a diameter of at least 150±0.2 mm and/or a thickness of 350±25 μm. It is, however, clear for a person skilled in the art that any other suitable dimensions may also be used with the principles according to the present invention.

The present invention furthermore provides a method for fabricating substrates according to the present invention. In particular, the present invention relates to a method of chamfering an essentially monocrystalline silicon carbide substrate, which comprises a main surface and a circumferential end face surface which is essentially perpendicular to the main surface, the method comprising the following steps:

working the substrate to fabricate a chamfered peripheral region, wherein a first bevel surface of the chamfered peripheral region includes a first bevel angle with said main surface, and wherein a second bevel surface of the chamfered peripheral region includes a second bevel angle with said end face surface, wherein, in more than 75% of the peripheral region, said first bevel angle has a value in a range between 20° and 50°, and said second bevel angle has a value in a range between 45° and 75°.

This method has the advantage that the mechanical stability is enhanced, and that fractures, breakouts, and chipping of the substrate can be avoided. Moreover, the yield of epitaxial deposition steps is enhanced.

According to an advantageous embodiment of the present invention, a form grinding wheel with a working cross section corresponding to said first and second bevel angles is used to generate the first and second bevel surfaces in one grinding step. This method has the advantage that both bevel surfaces can be fabricated in a single grinding step and with a single tool, thus reducing the processing times and the complexity of the grinding apparatus.

Alternatively, the first and second bevel surfaces may also be generated in separate steps and/or with separate tools. For instance, at least one cup wheel may be used for generating the first and second bevel surfaces. This solution has the advantage that smaller, less expensive grinding wheels are needed.

A particularly precise method of machining the substrate can be realized when the first and second bevel surfaces are generated by means of a laser cutting device. Thereby, the accuracy is enhanced and the processing time and costs are reduced. A further advantage of the laser technology is that no wear of the tools can occur.

Due to its lattice structure, the silicon carbide substrate exhibits as the outermost surface a silicon side and a carbon side. The silicon side is usually the side on which the epitaxial layers are grown. According to an advantageous embodiment of the present invention, the chamfered peripheral region with the determined bevel angle is arranged only on the silicon side of the substrate. The carbon side of the substrate, on the other hand, may have any arbitrary bevel angle. Thereby, the processing can be simplified because the measurement has to be performed only on one side. However, the double bevel according to the present invention may also be applied on both sides of the substrate.

The accompanying drawings are incorporated into the specification and form a part of the specification to illustrate several embodiments of the present invention. These drawings, together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements, and wherein:

FIG. 2 is a schematic illustration of a chamfering step according to a first embodiment of the present invention in a side view;

FIG. 3 is a schematic illustration of the chamfering step according to the first embodiment of the present invention in a top view;

FIG. 4 is a schematic illustration of a chamfering method according to a second embodiment of the present invention in a top view;

FIG. 5 is a schematic illustration of a first step of the chamfering method according to the second embodiment of the present invention in a side view;

FIG. 6 is a schematic illustration of a second step of the chamfering method according to the second embodiment of the present invention in a side view;

FIG. 7 is a schematic illustration of a chamfering method according to a third embodiment of the present invention in a top view;

FIG. 8 is a schematic illustration of the chamfering method according to the third embodiment of the present invention in a side view;

FIG. 9 is a schematic illustration of a chamfering method according to a fourth embodiment of the present invention in a top view;

FIG. 10 is a schematic illustration of a first step of the chamfering method according to the fourth embodiment of the present invention in a side view;

FIG. 11 is a schematic illustration of a second step of the chamfering method according to the fourth embodiment of the present invention in a side view;

FIG. 12 is a schematic illustration of a chamfering method according to a fifth embodiment of the present invention in a top view;

FIG. 13 is a schematic illustration of the chamfering method according to the fifth embodiment of the present invention in a side view.

Figure 1:
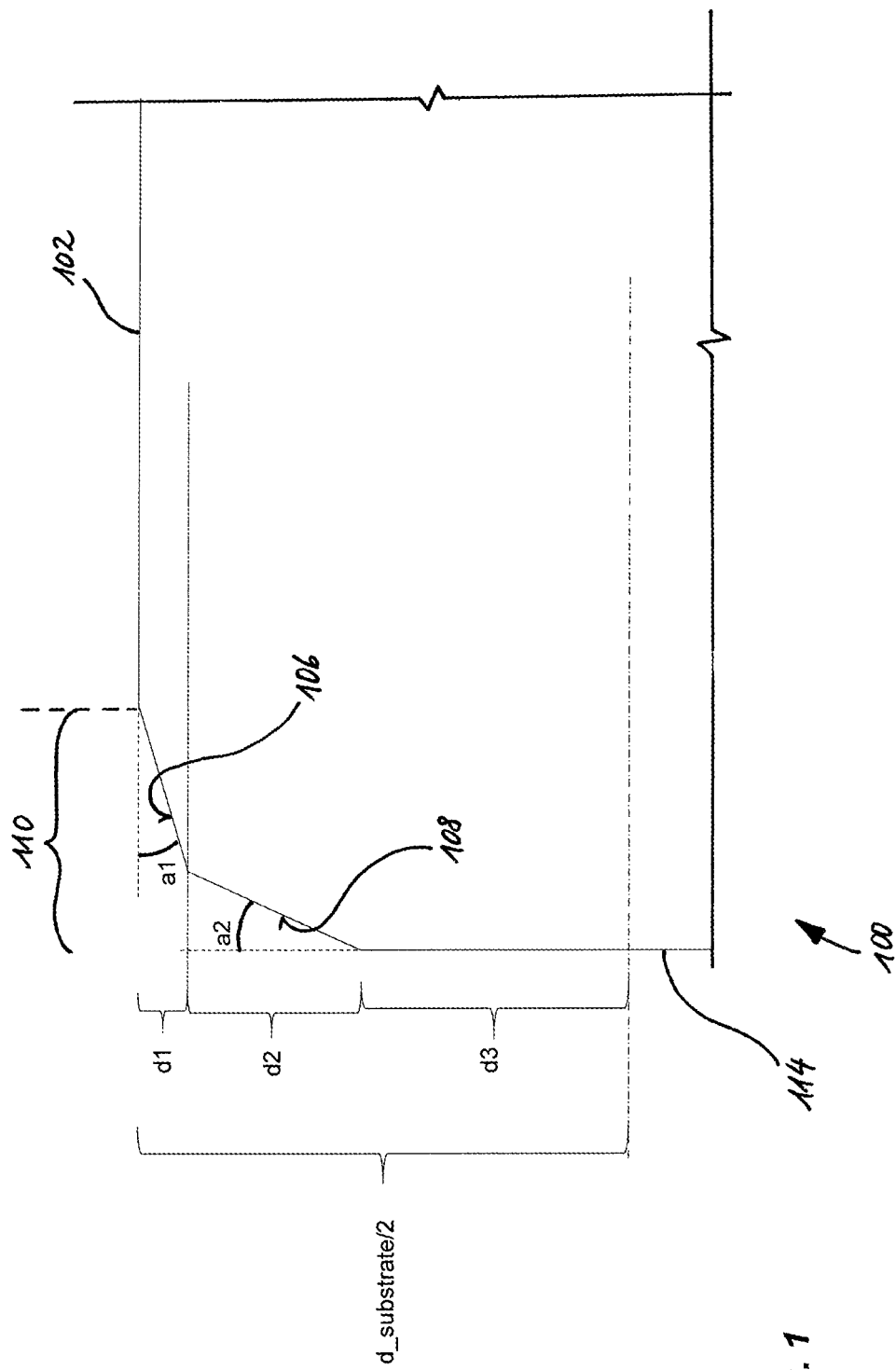
FIG. 1 is a schematic representation of an SiC substrate according to an advantageous embodiment of the present invention.

The present invention will now be explained in more detail with reference to the Figures and firstly referring to FIG. 1.

FIG. 1 shows a SiC substrate 100 according to a first advantageous embodiment of the present invention. It has to be noted that in all the Figures, dimensions are not to scale in order to illustrate the idea according to the present invention. In particular, the thickness of the substrate is shown extremely enlarged in comparison to the diameter.

The SiC substrate has a first surface 102 and a second surface 104 (see FIG. 2). In the following, the first surface 102 will be referred to as the main surface, where as the second surface 104 is also referred to as the bottom surface. Normally, the first surface 102 is the silicon surface of the SiC substrate 100, and the second surface 104 is the carbon surface of the substrate 100. The main surface 102 is the surface on which later epitaxial layers are deposited. As mentioned above, the SiC substrate 100 may be offcut at a tilt angle of 4° against the basal lattice plane. Due to the tilt angle, epitaxial growth is taking place as a step-flow growth.

In order to mechanically stabilize the substrate, the peripheral region of the essentially circular wafer is provided with a chamfered region 110. According to the present invention, the chamfered region 110 comprises a first bevel surface 106 and a second bevel surface 108. The first bevel surface 106 includes with the main surface 102 a first bevel angle a1. The second bevel surface 108 includes with the end face 114 a second bevel angle a2. By providing this double chamfering, a first thickness reduction d1 and a second thickness reduction d2 are deducted from the total thickness of the substrate 100 (in FIG. 1, half of the total substrate thickness is indicated by d_substrate/2). Consequently, the end face 114 has a remaining base height indicated as d3.

According to the present invention, the base height d3 of the end face 114 should be adjusted to the thickness of the rotor plate used for a DSP process. Thereby, the lateral pressure onto the substrate which is generated by the contact with the rotor cage can be absorbed to a high extent. Advantageously, the total base height 2×d3 amounts to at least one third of the total substrate thickness.

Advantageously, the angles a1 and a2 are chosen as to meet various requirements. Firstly, the first bevel surface 106 is intended to provide a defined inlet for a polishing cloth when performing a chemical mechanical polishing step. The angle a1 is chosen depending on the polishing process. In particular, in order to achieve a uniform transition from the substrate's main surface 102 into the chamfered region 110, a well defined small angle a1 is needed. Moreover, the dimensions of the first bevel surface 106 also depend on the characteristics of the polishing process, for instance the tuft depth of the polishing cloth and/or the viscosity and composition of the polishing suspension.

Secondly, the second bevel surface 108 stabilizes the end face 114 against lateral pressure which is caused during the double-sided polishing process. It can be shown that the mechanical stability can be enhanced by applying a small angle a2. Thereby, breakout, chipping and fractures of the substrate can be reduced.

According to the present invention, the first bevel angle a1 is in a range from 20° to 50° and the second bevel angle a2 is in a range from 45° to 75°. From obvious geometric considerations it can be derived that the sum of the angles a1 and a2 has to be smaller than 90°. In particular, a sum of a1+a2=90° denotes the case where the two bevel surfaces 106, 108 form one integral surface. When the sum a1+a2 is larger than 90°, this equals to the chamfered region being concave.

By providing the shown geometry according to FIG. 1, typical stress effects due to manufacturing processes can be absorbed to the largest possible extent. The mechanical load capacity of the edges can be enhanced because high supporting forces are possible when providing a small bevel angle a2 between the end face surface 114 and the bevel surface 108 adjacent thereto. Thereby, the present innovation minimizes the yield losses due to breakouts and fractures during substrate fabrication and during handling when performing the epitaxial processing. When performing a double sided polishing step, the rotor cage cannot exert vertical forces.

By ensuring a smooth transition from the main surface 102 (and the bottom surface 104) of the substrate 100 towards the edge without indentations, grooves, or scratches, the surface quality is not impaired during the polishing process because loosened particles, and scratches caused thereby can be avoided. Furthermore, no potential contamination sources remain for later process steps.

According to one alternative, this particular dimensioning of the chamfered region 110 is only applied to the silicon side 102, while the carbon side 104 may be provided with an arbitrary chamfering. However, the bottom side may of course also be provided with a double bevel chamfering, either symmetrical to the bevel angles on the silicon side, or different from the bevel angles on the silicon side.

Further, the silicon substrate 100 may for instance have a diameter of at least 150 mm and a thickness of not more than 1000 µm, at least 200 µm, preferably 350±25 µm. Advantageously, the first bevel surface has a roughness of 10 nm or less on at least 80% of its area, and the second bevel surface has a roughness of 25 nm or less on at least 80% of its area. The polytype of the substrate may for instance be 4H, 6H, 15R, and preferably is 4H. The tilt angle (offcut angle) between the main surface and a basal lattice plane orientation preferably is 4°, but may take any value between 0° and 8°.

With reference to FIGS. 2-13, now several possible fabrication methods for producing a substrate according to the present invention will be explained.

A first embodiment of the chamfering method according to the present invention is shown in FIGS. 2 and 3. According to this first technique, a form grinding wheel 112 is provided with a grinding groove 116 around its periphery. The grinding groove 116 has slanted surfaces 118 which include the desired angles a1 and a2 with a radial and a rotational axis of the wheel 112, respectively.

By rotating the grinding wheel 112 in a first direction 120 (for instance clockwise) and at the same time rotating the substrate 100 in the reverse direction (for instance counter-clockwise) and advancing the substrate 100 towards the center of the grinding wheel 112 as indicated by the arrow 124, both bevel surfaces 106, 108 according to FIG. 1 can be machined to the substrate 100 in one working step. Moreover, the double bevel surfaces according to the present invention may be applied in one step to the silicon surface 102 as well as to the carbon surface 104 of the substrate 100.

The disadvantage of this solution can be seen in the fact that a rather large grinding wheel 112 has to be fabricated having expensive, precisely fabricated slanted grinding surfaces 118, which cannot easily be regenerated when worn down.

In order to overcome these disadvantages, the technique illustrated in FIGS. 4-6 using a cup wheel 126 or other small angle grinder can be applied. The substrate 100 and the grinding wheel 126 rotate in different directions. According to this method, the substrate 100 is advanced in the direction 124 towards the cup wheel 126. The cup wheel 126 is arranged with its grinding surface 130 at a defined angle with respect to the rotational axis 128 of the substrate 100. In this manner, the two bevel surfaces can be machined in two separate steps. Advantageously, the second bevel surface 108 having the angle a2 with respect to the rotational axis 128 of the substrate 100 is machined first (in the step shown in FIG. 5). In the next step (illustrated in FIG. 6) the cup wheel 126 is tilted to include an angle a1 with the main surface 102 of the substrate 100, and the substrate is moved towards the grinding wheel 126 in the direction 124, so that the first bevel surface is machined.

In order to save time, the grinding method using a cup wheel 126 may also be performed by using two cup wheels 126a, 126b which are arranged at the peripheral region of the rotating substrate 100. This arrangement is shown in FIG. 7 (top view) and FIG. 8 (side view). Advantageously, the first cup wheel 126a is tilted to include an angle of a2 with the rotational axis 128, while the second cup wheel 126 the includes an angle a1 with the main surface 102 of the substrate (in other words, the second cup wheel 126 includes an angle of (90°—a1) with the rotational axis 128).

In the embodiments shown in FIGS. 4-6, 7, and 8, only the upper side 102 of the substrate 100 is machined to have the double bevel surfaces 106, 108 according to the present invention. The underside 104 may of course undergo the same chamfering procedure or may be equipped with a more simple chamfering.

All mechanical grinding wheels have the disadvantage that they wear off during use. This is in particular true with silicon carbide substrates that have an extreme hardness.

Consequently, according to an advantageous embodiment, the bevel surfaces 106, 108 are fabricated by using a laser cutting device 132 as shown in a top view in FIG. 9. The substrate 100 is rotating as indicated by arrow 122 (which may be clockwise as shown, but also counterclockwise), while a laser beam 134 is directed under an angle towards the center of the substrate 100.

In order to generate the two different bevel angles a1 and a2 according to the present invention, the laser cutting device 132 is first arranged to emit radiation 134 under an angle a2 with respect to the rotational axis of the substrate 100 as shown in FIG. 10, whereby the second bevel surface 108 is created when the substrate 100 is advanced towards the beam 134 in direction 124.

In a next step (shown in FIG. 11), the substrate 100 is machined by means of a laser cutting device 132 with its radiation 134 emitted under an angle a1 with respect to the main surface 102.

The laser cutting technique may of course also be performed within one working step as illustrated by the top view of FIG. 12 and the side view of FIG. 13.

According to this embodiment of the present invention, the laser cutting device 132 is rotatable so that the angle under which the radiation 134 is emitted can be varied. For instance, first the second bevel surface having an angle a2 with the rotational axis 128 is machined, and next the laser cutting device 132 is tilted (as indicated by the broken lines) to form the first bevel surface having an angle a1 with the main surface 102.

REFERENCE NUMERALS

| Reference Numeral | Description |
| --- | --- |
| 100 | SiC substrate |
| 102 | Main surface; Si side |
| 104 | Bottom surface; C side |
| 106 | First bevel surface |
| 108 | Second bevel surface |
| 110 | Chamfered region |
| 112 | Form grinding wheel |
| 114 | End face surface |
| 116 | Grinding groove |
| 118 | Slanted grinding surface |
| 120 | Rotating direction of grinding wheel |
| 122 | Rotating direction of substrate |
| 124 | Advancing direction of substrate |
| 126; 126a, 126b | Cup wheel |
| 128 | Rotational axis of substrate |
| 130 | Grinding surface |
| 132 | Laser cutting device |
| 134 | Laser beam |
| a1 | First bevel angle |
| a2 | Second bevel angle |

We claim:

1. Silicon carbide substrate which is essentially monocrystalline, the silicon carbide substrate comprising:
    a main surface and a circumferential end face surface which is essentially perpendicular to the main surface, and a chamfered peripheral region, wherein a first bevel surface of the chamfered peripheral region includes a first bevel angle (a1) with said main surface, and wherein a second bevel surface of the chamfered peripheral region includes a second bevel angle (a2) with said end face surface, wherein, in more than 75% of the peripheral region, said first bevel angle (a1) has a value in a range between 20° and 50°, and said second bevel angle (a2) has a value in a range between 45° and 75°, and wherein a total base height of the end face surface amounts to at least one third of the total substrate thickness.

2. Silicon carbide substrate according to claim 1, wherein a sum of said first bevel angle (a1) and said second bevel angle (a2) has a value (a1+a2) of less than 90°.

3. Silicon carbide substrate according to claim 1, wherein the chamfered peripheral region is arranged on at least 85% of the circumference of the substrate.

4. Silicon carbide substrate according to claim 1, wherein said first bevel surface has a surface roughness of equal to or less than 10 nm.

5. Silicon carbide substrate according to claim 1, wherein said second bevel surface has a surface roughness of equal to or less than 25 nm.

6. Silicon carbide substrate according to claim 1, wherein the substrate has a polytype selected from a group comprising 4H, 6H, 15R, and 3C.

7. Silicon carbide substrate according to claim 1, wherein a tilt angle between the main surface and a basal lattice plane of the substrate is in a range between 0° and 8°.

8. Silicon carbide substrate according to claim 1, wherein the substrate has a thickness of at least 200 μm and not more than 1000 μm.

9. Silicon carbide substrate according to claim 1, wherein the substrate has a diameter of at least 150±0.2 mm.

10. Silicon carbide substrate according to claim 1, wherein the chamfered peripheral region is arranged on at least 95% of the circumference of the substrate.

11. Silicon carbide substrate according to claim 1, wherein the substrate has a thickness of 350±25 μm.

12. Method of chamfering an essentially monocrystalline silicon carbide substrate, which comprises a main surface and a circumferential end face surface which is essentially perpendicular to the main surface, the method comprising the following steps:
    working the substrate to fabricate a chamfered peripheral region, wherein a first bevel surface of the chamfered peripheral region includes a first bevel angle (a1) with said main surface, and wherein a second bevel surface of the chamfered peripheral region includes a second bevel angle (a2) with said end face surface,
    wherein, in more than 75% of the peripheral region, said first bevel angle (a1) has a value in a range between 20° and 50°, and said second bevel angle (a2) has a value in a range between 45° and 75°, and wherein a total base height of the end face surface amounts to at least one third of the total substrate thickness.

13. Method according to claim 12, wherein a form grinding wheel with a working cross section corresponding to said first and second bevel angles (a1, a2) is used to generate the first and second bevel surfaces in one grinding step.

14. Method according to claim 12, wherein the first and second bevel surfaces are generated in separate steps with the same tool.

15. Method according to claim 12, wherein at least one cup wheel is used for generating the first and second bevel surfaces.

16. Method according to claim 12, wherein the first and second bevel surfaces are generated by means of a laser cutting device.

17. Method according to claim 12, wherein the silicon carbide substrate comprises a silicon side and a carbon side, and wherein the chamfered peripheral region with the determined bevel angles (a1, a2) is arranged only on the silicon side of the substrate.

18. Method according to claim 12, wherein the first and second bevel surfaces are generated with separate tools.

\* \* \* \* \*